(12) United States Patent
Nalamasu et al.

(10) Patent No.: US 6,852,648 B2
(45) Date of Patent: Feb. 8, 2005

(54) SEMICONDUCTOR DEVICE HAVING A LOW DIELECTRIC CONSTANT DIELECTRIC MATERIAL AND PROCESS FOR ITS MANUFACTURE

(75) Inventors: Omkaram Nalamasu, Bridgewater, NJ (US); Chien-Shing Pai, Bridgewater, NJ (US); Elsa Reichmanis, Westfield, NJ (US); Shu Yang, New Providence, NJ (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 10/435,561

(22) Filed: May 9, 2003

(65) Prior Publication Data

US 2003/0207595 A1 Nov. 6, 2003

Related U.S. Application Data

(62) Division of application No. 09/670,737, filed on Sep. 27, 2000, now abandoned.

(51) Int. Cl.$^7$ .................. H01L 21/31; H01L 21/469
(52) U.S. Cl. .................. 438/781; 438/778; 438/780; 438/623; 438/960
(58) Field of Search .................. 438/778, 780, 438/781, 623, 960

(56) References Cited

U.S. PATENT DOCUMENTS

| | | | |
|---|---|---|---|
| 5,773,197 A | 6/1998 | Carter et al. ............ 430/313 |
| 5,883,219 A | 3/1999 | Carter et al. ............ 528/310 |
| 5,889,104 A * | 3/1999 | Rosenmayer ............ 524/545 |
| 5,895,263 A | 4/1999 | Carter et al. ............ 438/624 |
| 5,928,791 A * | 7/1999 | Rosenmayer ............ 428/421 |
| 6,093,636 A * | 7/2000 | Carter et al. ............ 438/623 |
| 6,271,273 B1 * | 8/2001 | You et al. ............ 521/61 |
| 6,342,454 B1 * | 1/2002 | Hawker et al. ............ 438/780 |
| 6,444,776 B1 * | 9/2002 | Holland et al. ............ 528/26 |

* cited by examiner

*Primary Examiner*—Maria F. Guerrero
(74) *Attorney, Agent, or Firm*—Lerner, David, Littenberg Krumholz & Mentlik, LLP

(57) ABSTRACT

A process for fabricating an integrated semiconductor device with a low dielectric constant material and an integrated semiconductor device with the low dielectric constant material interposed between two conductors is disclosed. The low dielectric constant material has a dielectric constant of less than about 2.8. The low dielectric constant material is a porous glass material with an average pore size of less than about 10 nm. The low dielectric constant material is formed on a semiconductor substrate with circuit lines thereover by combining an uncured and unmodified glass resin with an amphiphilic block copolymer. The amphiphilic block copolymer is miscible in the uncured glass resin. The mixture is applied onto the semiconductor substrate and the glass resin is cured. The glass resin is further processed to decompose or otherwise remove residual block copolymer from the cured glass resin.

16 Claims, 1 Drawing Sheet

SEMICONDUCTOR DEVICE HAVING A LOW DIELECTRIC CONSTANT DIELECTRIC MATERIAL AND PROCESS FOR ITS MANUFACTURE

This Application is a divisional application of U.S. Ser. No. 09/670,737 filed on Sep. 27, 2000, the disclosure of which is incorporated by reference.

BACKGROUND OF THE INVENTION

TECHNICAL FIELD

The present invention relates to semiconductor devices comprising an improved porous dielectric material and a process for fabricating the semiconductor device.

ART BACKGROUND

There is a continuing desire in the microelectronics industry to increase the circuit density in integrated semiconductor devices such as multilevel integrated circuit devices, e.g., memory and logic chips, thereby increasing their performance and reducing their cost. In order to accomplish this goal, there is a desire to reduce the minimum feature on the chip, e.g., circuit linewidth, and also to decrease the dielectric constant of the interposed dielectric material to enable closer spacing of circuit lines without a significant increase in crosstalk and capacitive coupling. Further, there is a desire to reduce the dielectric constant for the dielectric materials such as utilized in the back end of the line (BEOL) portion of integrated circuit devices, which contain input/output circuitry, to reduce the requisite drive current and power consumption for the device. The dielectric material presently used in the industry is silicon dioxide which has a dielectric constant of about 4.0. This material has the requisite mechanical and thermal properties to withstand processing operations and thermal cycling associated with semiconductor device manufacturing. However, it is desired that dielectric materials for future integrated circuit devices exhibit a lower dielectric constant (e.g.,<3.0) than exhibited by silicon dioxide.

Dielectric materials are disclosed in U.S. Pat. No. 5,883,219 to Carter et al. The dielectric materials in Carter et al. are porous and are described as the reaction product of an organic polysilicate (e.g., silsesquioxane) and polyamic ester terminated with a trialkoxysilylalkyl group. The dielectric composition is formed by dissolving: (i) a decomposable polymer: (ii) silsesquioxane: and (iii) the alkoxysilyl alkyl end-capped polyamic ester in a solvent. The decomposable polymer either forms micelles, is a cross-linked insoluble nanosphere or is a hyperbranched macromolecule with surface reactive groups that are condensable with the organic polysilicon. Although a porous dielectric material results, a dielectric material with a lower dielectric constant and a process for forming a porous dielectric that is less complex, and provides an environment in which the size and distribution of pores in the dielectric is more readily controlled, is desired.

SUMMARY OF THE INVENTION

The present invention is directed to a porous dielectric material and an integrated semiconductor device in which the porous dielectric material is formed over and/or between circuit lines positioned on a semiconductor substrate. The porous dielectric material has a dielectric constant in the range of about 1.4 to about 2.8. The porous dielectric material has an average pore size that is less than about 10 nm. The process of the present invention is capable of forming a dielectric material that has an average pore size that is in the range of about 1 nm to about 4 nm.

The porous dielectric material can be formed by dispersing an amphiphilic block copolymer in an unmodified glass resin and curing the unmodified glass resin to form a matrix. In the context of the present invention, the glass resin is unmodified in the sense that it is not a reaction product of a glass resin and another compound (e.g. the polyamic esters described in U.S. Pat. No. 5,883,219 to Carter et al.). In Carter et al. the glass resin is condensed with polyamic ester to provide the modified glass resin. The inventive process is much more efficient than the process described in either U.S. Pat. No. 5,883,219 or U.S. Pat. No. 5,895,263 (both to Carter et al.). In the process of the present invention the polymer is chosen to combine with the unmodified glass resin to form a miscible mixture. In the Carter et al. patents, either the glass resin or the polymer is modified to form the miscible mixture.

In the present invention, the block copolymer defines pore regions in the glass matrix. After the glass matrix is formed, the matrix is heated to a temperature sufficient to decompose the block copolymer that defines the pore regions, thereby leaving pores in the glass matrix.

The block copolymer is a sequence of two or more homopolymeric chains (i.e. blocks) linked together. For purposes of illustration, in a diblock copolymer, the first block is polymer A and the second block is polymer B. The lengths of polymers A and B range from a few units to several thousand units. The block copolymer is illustrated by the structure poly(A–B). The block copolymers are amphiphilic. That is, the copolymer contains at least two blocks that are of opposite character. For example, the block copolymer contains a first block that is hydrophobic (i.e. the first block has no affinity for water) and a second block that is hydrophilic (i.e. the second block has an affinity for water). As used herein hydrophilicity and hydrophobicity are determined using the logP method. The logP method for determining hydrophilicity or hydrophobicity is well known to one skilled in the art. Specifically, logP is the octanol/water partition coefficient. LogP therefore serves as a hydrophobic bonding constant. The logP of a compound is its relative hydrophobicity. That is, the higher the lopP of a compound, the more hydrophobic that compound is.

One example of a suitable block copolymer is poly (propylene oxide-ethylene oxide). In this block copolymer, the polypropylene oxide (PPO) is hydrophobic and the polyethylene oxide (PEO) is hydrophilic. Another example of a block copolymer is poly(methacrylic acid-perfluorinated methacrylate). In this block copolymer, the polymethacrylic acid (PMAA) is hydrophilic and the perfluorinated methacrylate (FnMA) is hydrophobic.

In another example, the block copolymer is a triblock copolymer. A triblock copolymer has three blocks, two of which are of one character and one of which is of the opposite character. In this example, the middle polymer has a character opposite to that of the end polymers. One exemplary triblock copolymer is PEO-PPO-PEO. In this example, PEO is hydrophilic and PPO is hydrophobic. The end polymers in the triblock copolymer are not required to be the same polymer, but they are required to be of the same character.

The block copolymer is combined with an uncured glass resin. The uncured glass resin is selected to be miscible with one of the polymer blocks. Thus, in order to obtain the desired miscibility, an uncured glass resin that has the same character as one of the polymer blocks is selected. For example, if the block copolymer has a first polymer that is hydrophilic and a second polymer that is hydrophobic, miscibility is obtained by combining the block copolymer with an uncured glass resin that is either hydrophilic or hydrophobic. For example, the PEO block in the block copolymer PEO-PPO-PEO is hydrophilic. The PEO block is miscible in a hydrophilic uncured glass resin. Uncured methyl silsesquioxane (MSQ) has silanol groups (—SiOH), which make the uncured glass resin hydrophilic. Thus, the block copolymer PEO-PPO-PEO is miscible in uncured methyl silsesquioxane.

Although applicants do not wish to be held to a particular theory, applicants believe that the opposing character of adjacent blocks in the block copolymer causes the blocks to repel one another. This repulsion causes a microphase separation. This repulsion is believed to contribute to the miscibility of the block copolymer in the uncured glass resin. Upon cure, the glass resin retains its structure, and the block copolymer defines the pores in the glass resin. The resulting microphase separation provides a porous dielectric material that has superior mechanical, thermal and electrical properties when compared to previous porous dielectric materials.

DETAILED DESCRIPTION

Figure 1:
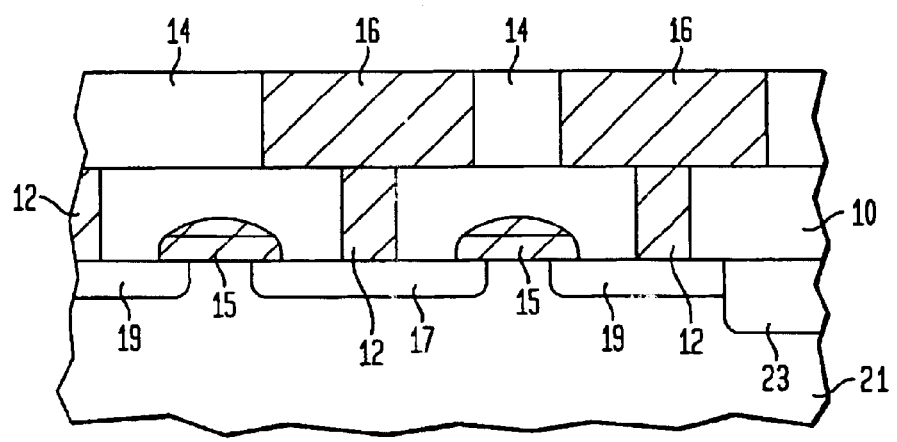
FIG. 1 is a cross-section of a portion of an integrated circuit device formed by the process of the present invention.

An embodiment of an integrated semiconductor device formed from the process of the present invention is illustrated in FIG. 1. The device has a substrate 21 with metallized vias 12 formed in a patterned dielectric layer 10 formed on the substrate 21. The substrate 21 had field oxide regions 23 formed therein. The metallized vias 12 are in contact with source and drain regions (17 and 19) of the illustrated transistors having gates 15. A patterned layer of dielectric material 14 is formed on the patterned dielectric layer 10. Metallic circuit lines 16 in contact with the metallized vias 12 are formed on layer 10. The metallic circuit lines 16 are electrically isolated from one another by a patterned layer of dielectric material 14.

Suitable substrate materials include, for example, silicon, silicon dioxide, glass, silicon nitride, ceramics, aluminum, copper, indium phosphide, silicon germanium and gallium arsenide. Thus, semiconductor devices as used herein, are not limited to silicon devices, but devices made of any suitable semiconductor material. Other suitable substrate materials are well known to one skilled in the art. In integrated circuits there are typically more than one layer of metal circuit lines formed over the active semiconductor devices. Each layer of insulated metal circuit lines is referred to as a level of metal. In the present invention, a device with one or more layers of insulated, planarized circuit lines can function as a substrate.

Suitable circuit lines are a metallic, electrically conductive material such as copper, aluminum, tungsten, gold, silver, or alloys thereof. Optionally, the circuit lines are coated with a metal such as a layer of nickel, tantalum or chromium or other layers such as barrier or adhesion layers (e.g. SiN, TiN).

In the present invention, a dielectric material is formed on the substrate and positioned on and/or between the circuit lines on the substrate. In integrated circuits with multiple levels of metal, the dielectric material is optionally planarized to function as a planar substrate for the formation of the next layer of circuit lines thereon. The dielectric material is a porous organic polysilicate compound. The average pore size is less than 10 nm. The organic polysilicate contains silicon, oxygen, carbon and hydrogen atoms. Suitable organic polysilicate compounds include (1) silsesquioxanes; (2) partially condensed alkoxysilanes (i.e. partially condensed by controlled hydrolysis of tetraethoxysilane having an Mn of about 500 to 20,000); (3) organically modified silicates having the composition $RSiO_3$ (wherein R is an organic substituent) and (4) partially condensed orthosilicates having the composition $SiOR_4$. Silsesquioxanes are polymeric silicate materials of the type $RSiO_{1.5}$ where R is an organic substituent.

Suitable organic polysilicates for use in the present invention are known to those skilled in the art. Preferably, the organic polysilicate is a silsesquioxane. Suitable silsesquioxanes for the present invention are alkyl (e.g. methyl), aryl (e.g. phenyl) or alkyl/aryl silsesquioxanes that are commercially available (e.g. methyl silsequioxane is commercially available as GR650 from Techneglass, Perrysburg, Ohio). Other suitable silsesquioxanes are known to those skilled in the art.

The porous organic polysilicate is formed by combining the uncured precursor of the organic polysilicon compound with a block copolymer. The block copolymer is a sequence of two or more homopolymeric chains (i.e. blocks) linked together. The block copolymers are amphiphilic. That is, the copolymer contains at least two blocks that are of opposite character. For example, the block copolymer contains a first block that is hydrophobic and a second block that is hydrophilic. As previously noted, hydrophilicity or hydrophobilicity as used herein, is determined by the logP method. Specifically, logP serves as a hydrophobic bonding constant. The logP of a compound indicates its relative hydrophobicity (i.e. its relative affinity or lack of affinity to water). The higher the value of logP, the more hydrophobic the compound. Hydrophobicity is calculated herein using ACD/LABS® software which is obtained commercially from Advanced Chemistry Development, Inc. of Toronto, Ontario, Canada. The logP method for determining relative hydrophobicity/hydrophilicity is also described in *Handbook of Chemical Property Estimation*, (ACS pub. 1990), which is hereby incorporated by reference.

One example of a suitable block copolymer is poly (propylene oxide-ethylene oxide). In this block copolymer, the polypropylene oxide (PPO) is hydrophobic and the polyethylene oxide (PEO) is hydrophilic. Another example of a block copolymer is poly(methacrylic acid-perfluorinated methacrylate). In this block copolymer, the polymethacrylic acid (PMAA) is hydrophilic and the perfluorinated methacrylate (FnMA) is hydrophobic.

In another example, the block copolymer is a triblock copolymer. A triblock copolymer has three blocks, two of which are of one character and one of which is of the opposite character. In this example, the middle polymer has a character that is opposite to that of the end polymers. One exemplary triblock copolymer is PEO-PPO-PEO. In this example, PEO is hydrophilic and PPO is hydrophobic. The end polymers in the triblock copolymer are not required to be the same polymer, but they are required to be of the same character.

Since the size of the block copolymers determines the size of the pores, it is advantageous if the size of the block copolymers is substantially uniform. The size distribution of the block copolymers is characterized by the molecular weight distribution. The molecular weight distribution is in turn characterized by the ratio of the weight average molecular weight ($M_w$) and the number average molecular weight ($M_n$). This average is referred to as the polydispersity index (PDI). The larger the polydispersity, the broader the molecular weight distribution.

The uncured organic polysilica precursor has the same character of one of the polymer blocks and, consequently, the opposite character of the other polymer block. For example, if the block copolymer has a first polymer block that is hydrophilic and a second polymer block that is hydrophobic, miscibility is obtained by combining the block copolymer with an uncured glass resin that is either hydrophilic or hydrophobic. The relative amounts of the polymer blocks of opposite character is largely a matter of design choice. Generally, the block copolymer is about 5 weight percent to about 95 weight percent of the first character type and about 95 weight percent to about 5 weight percent (i.e. the remainder) of the second, opposite, character type. It is advantageous if the block copolymer is about 10 weight percent to about 90 weight percent of the first character type and the remainder of the second character type. It is particularly advantageous if the block copolymer is about 20 weight percent to about 80 weight percent of the first character type and the remainder of the second, opposite, character type. The relative amounts of the two polymer blocks are selected to balance the effects of the polymer blocks so that the desired microphase separation occurs in the uncured glass resin. For example, if the first polymer block is weakly hydrophilic and the second block is strongly hydrophobic, the block copolymer will have a greater weight percent of the first polymer block than the second polymer block.

For example, the PEO block in the block copolymer PEO-PPO-PEO is hydrophilic. The PEO block is miscible in a hydrophilic uncured glass resin. Uncured methyl silsesquioxane (MSQ) has silanol groups (—SiOH), which make the uncured glass resin hydrophilic. Thus, the block copolymer PEO-PPO-PEO is miscible in uncured silsesquioxane.

The dielectric material is formed on a substrate by mixing the glass resin and block copolymer together. The mixture is about 5 weight percent to about 75 weight percent block copolymer and 95 weight percent to about 25 weight percent glass resin (excluding solvent). It is advantageous if the mixture is about 10 weight percent to about 60 weight percent block copolymer and 90 weight percent to 40 weight percent glass resin. Mixtures of about 10 weight percent to about 50 weight percent block copolymer and 90 weight percent to about 50 weight percent glass resin are particularly advantageous. The resulting mixture is combined with a spinning solvent. Conventional solvents are contemplated as suitable. Suitable solvents for glass resins are typically hydrophilic. Methanol and n-butanol are examples of a suitable solvent.

The dielectric material is formed on the substrate by applying the mixture onto the substrate and baking the substrate at a temperature of about 100° C. to about 140° C. The wafer is baked to evaporate the solvent and to precure the glass resin. The duration of the baking step depends largely on the apparatus used. For example, on a hotplate the time for this step is about 30 seconds to about 2 minutes. In an oven, the time for this step is about 10 minutes to about 60 minutes. It is advantageous, but not required for the baking temperature to be above the glass transition temperature ($T_g$) of at least one of the block polymers that make up the block copolymer.

The substrate is then heated to cure the glass resin and decompose the block copolymer. The temperature is selected so that the glass resin cures before the block copolymer decomposes. Generally, temperatures in the range of about 200° C. to about 500° C. are contemplated as suitable. For the block copolymers of PPO and PEO, temperatures in the range of about 400° C. to about 500° C. are suitable. The rate at which the substrate is heated is largely a matter of design choice. Again, the rate is selected so that the glass resin is cured before the block copolymers completely decompose. Rates of about 1° C./min to about 20° C./min are suitable, but faster rates are also contemplated.

After the glass resin is cured, the substrate is maintained at an elevated temperature (e.g. above about 400° C.) in inert gas (e.g. argon) or under vacuum. Maintaining the substrate at this temperature for the prescribed period decomposes and removes the block copolymers from the resin resulting in a porous glass material. The duration of this step also depends upon the apparatus used. The porous glass material has a dielectric constant of less than about 2.8. It is advantageous if the dielectric constant is less than about 2. In certain advantageous embodiments, the dielectric constant is about 1.4. The average pore size diameter is less than about 10 nm.

EXAMPLE 1

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 4950 and was thirty percent by weight PEO and seventy weight percent PPO. The block copolymer was twenty-seven volume percent PEO and seventy-three volume percent PPO.

The solution was then spun at 2000 rpm on a TiN-coated silicon wafer. The wafer was baked at a temperature of about 100° C. for about 30 minutes to remove the solvent and precure the glass resin. The coated wafer was placed in a nitrogen atmosphere. The wafer was then heated to a temperature of 500° C. at a rate of 1.5° C./min. The wafer was then maintained at 500° C. for 2 hours.

The density of the resulting dielectric material, measured by x-ray reflectivity, was 0.863 g/cm$^3$. The wall density (measured by small angle neutron scattering (SANS)) was 1.612. The porosity and pore sizes (also measured by SANS) were 36.5 percent of volume and 0.926 nm, respectively. The dielectric material had a Young's modulus and hardness, both measured by nano-indentation, of 2.66±0.40 GPa and 0.47±0.12 GPa, respectively. The dielectric constant of the resulting material was about 1.9 to about 2.1.

EXAMPLE 2

A solution of polymer and glass resin was prepared by combining a block copolymer of PEO-PPO-PEO and MSQ. The solution contained thirty percent by weight block copolymer and seventy percent glass resin (excluding solvent). The block copolymer had a molecular weight of 11,400 and was eighty percent by weight PEO and twenty weight percent PPO. The block copolymer was seventy-eight volume percent PEO and twenty-two volume percent PPO.

The solution was then spun at 2000 rpm on a TiN-coated silicon wafer. The wafer was baked at a temperature of about 100° C. for about thirty minutes to remove the solvent and precure the glass resin. The coated wafer was placed in a nitrogen atmosphere. The wafer was then heated to a temperature of 500° C. at a rate of 1.5° C./min. The wafer was then maintained at 500° C. for 2 hours.

The density of the resulting dielectric material, measured by x-ray reflectivity, was 0.877 g/cm$^3$. The wall density (measured by small angle neutron scattering (SANS)) was 1.354. The porosity and pore sizes (also measured by SANS) were 28.6 volume percent and 0.945 nm, respectively. The dielectric material had a Young's modulus and hardness, both measured by nano-indentation, of 2.96±0.40 GPa and 0.59±0.14 GPa, respectively. The dielectric constant of the material was about 2 to 2.1.

EXAMPLE 3

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 4950 and was thirty percent by weight PEO and seventy weight percent PPO. The block copolymer was twenty-seven volume percent PEO and seventy-three volume percent PPO.

The solution was then spun at 2000 rpm for 30 seconds on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 1 hour. The wafer was heated to a temperature of 400° C. at a rate of 1.5° C./min and was maintained at 400° C. for 1 hour.

The dielectric constant of the resulting material was about 2 to 2.2. The Young's modulus and hardness both measured by nanoindentation were 2.72 and 0.60 GPa respectively.

EXAMPLE 4

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 4950 and was thirty percent by weight PEO and seventy weight percent PPO. The block copolymer was twenty-seven volume percent PEO and seventy-three volume percent PPO.

The solution was then spun at 2000 rpm for 30 second on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 1 hour. The wafer was heated to a temperature of 450° C. at a rate of 1.5° C./min and was maintained at 450° C. for 1 hour.

The dielectric constant of the resulting material was about 2 to 2.1.

EXAMPLE 5

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 11,400 and was eighty percent by weight PEO and twenty weight percent PPO. The block copolymer was seventy-eight volume percent PEO and twenty-two volume percent PPO.

The solution was then spun at 2000 rpm for 30 seconds on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 2 hours. The wafer was heated to a temperature of 400° C. at a rate of 1.5° C./min and was maintained at 400° C. for 1 hour.

The dielectric constant of the resulting material was about 2 to 2.2. The Young's modulus and hardness (both measured by nanoindentation) were 2.39 and 0.51 Gpa, respectively.

EXAMPLE 6

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 11,400 and was eighty percent by weight PEO and twenty weight percent PPO. The block copolymer was seventy-eight volume percent PEO and twenty-two volume percent PPO.

The solution was then spun at 2000 rpm for 30 seconds on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 2 hours. The wafer was heated to a temperature of 450° C. at a rate of 1.5° C./min and was maintained at 450° C. for 1 hour.

The dielectric constant of the resulting material was about 2 to 2.1.

EXAMPLE 7

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 6500 and was fifty percent by weight PEO and fifty weight percent PPO. The block copolymer was forty-three volume percent PEO and fifty-seven volume percent PPO.

The solution was then spun at 2000 rpm for 30 seconds on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 2 hours. The wafer was heated to a temperature of 500° C. at a rate of 1.5° C./min and was maintained at 500° C. for 2 hours.

The dielectric constant of the resulting material was about 1.9 to 2.1. The average pore size, measured by Positronium Annihilation Lifetime Spectroscopy (PALS), was 3.4 nm.

EXAMPLE 8

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 4700 and was eighty percent by weight PEO and twenty weight percent PPO. The block copolymer was twenty-seven volume percent PEO and seventy-three volume percent PPO.

The solution was then spun at 2000 rpm for 30 seconds on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 1 hour. The wafer was heated to a temperature of 500° C. at a rate of 1.5° C./min and was maintained at 500° C. for 2 hour.

The dielectric constant of the resulting material was about 1.9 to about 2.1. The average pore size, measured by PALS, was 3.5 nm.

EXAMPLE 9

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 11,400 and was eighty percent by weight PEO and twenty weight percent PPO. The block copolymer was seventy-eight volume percent PEO and twenty-two volume percent PPO.

The solution was then spun at 2000 rpm for 30 seconds on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 2 hours. The wafer was heated to a temperature of 400° C. at a rate of 10° C./min and was maintained at 400° C. for 1 hour.

The dielectric constant of the resulting material was about 2 to about 2.2.

EXAMPLE 10

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 11,400 and was eighty percent by weight PEO and twenty weight percent PPO. The block copolymer was seventy-eight volume percent PEO and twenty-two volume percent PPO.

The solution was then spun at 2000 rpm for 30 seconds on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 2 hours. The wafer was heated to a temperature of 400° C. at a rate of 20° C./min and was maintained at 400° C. for 1 hour.

The dielectric constant of the resulting material was about 2 to about 2.2.

EXAMPLE 11

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 11,400 and was eighty percent by weight PEO and twenty weight percent PPO. The block copolymer was seventy-eight volume percent PEO and twenty-two volume percent PPO.

The solution was then spun at 2000 rpm for 30 seconds on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 2 hours. The wafer was heated to a temperature of 450° C. at a rate of 10° C./min and was maintained at 450° C. for 1 hour.

The dielectric constant of the resulting material was about 2.1 to about 2.2.

EXAMPLE 12

A solution of polymer and glass resin was prepared by combining a block copolymer of PEO-PPO-PEO and MSQ. The solution contained thirty percent by weight block copolymer and seventy percent by weight glass resin (excluding solvent). The block copolymer had a molecular weight of 11,400 and was eighty percent by weight PEO and twenty weight percent PPO. The block copolymer was seventy-eight volume percent PEO and twenty-two volume percent PPO.

The solution was then spun at 2000 rpm for 30 seconds on a TiN-coated silicon wafer. The coated wafer was first baked at a temperature of about 100° C. for about 30 minutes to remove the solvent and precure the glass resin. Then the wafer was placed in a nitrogen atmosphere and soaked for more than 2 hours. The wafer was heated to a temperature of 450° C. at a rate of 20° C./min and was maintained at 450° C. for 1 hour.

The dielectric constant of the resulting material was about 2 to 2.1.

EXAMPLE 13

A solution of polymer and glass resin was prepared by combining a block copolymer of PEO-PPO-PEO and MSQ. The solution contained forty percent by weight of block copolymer and sixty percent glass resin (excluding solvent). The block copolymer had a molecular weight of 4950 and was thirty percent by weight PEO and seventy weight percent PPO. The block copolymer was twenty-seven volume percent PEO and seventy-three volume percent PPO.

The solution was then spun at 2000 rpm for 30 seconds on a Si wafer coated with TiN. The coated wafer was first baked at a temperature of about 100° C. for about 30 minutes to remove the solvent and precure the glass resin. Then the wafer was placed in a nitrogen atmosphere and soaked for more than 1 hour. The wafer was heated to a temperature of 500° C. at a rate of 1.5° C./min and was maintained at 500° C. for 2 hours.

The dielectric constant of the resulting material was in the range of about 1.7 to about 1.8.

EXAMPLE 14

A solution of polymer and glass resin was prepared by combining a block copolymer of PEO-PPO-PEO and MSQ. The solution contained fifty percent by weight of block copolymer and fifty percent glass resin (excluding solvent). The block copolymer had a molecular weight of 4950 and was thirty percent by weight PEO and seventy weight percent PPO. The block copolymer was twenty-seven volume percent PEO and seventy-three volume percent PPO.

The solution was then spun at 2000 rpm for 30 seconds on a Si wafer coated with TiN. The coated wafer was first baked at a temperature of about 100° C. for about 30 minutes to remove the solvent and precure the glass resin. Then the wafer was placed in a nitrogen atmosphere and soaked for more than 1 hour. The wafer was heated to a temperature of 500° C. at a rate of 1.5° C./min and was maintained at 500° C. for 2 hours.

The dielectric constant of the resulting material was in the range of about 1.4 to about 1.6.

EXAMPLE 15

A solution of polymer and glass resin was prepared by combining a block copolymer of PEO-PPO-PEO and MSQ. The solution contained forty percent by weight of block copolymer and sixty percent glass resin (excluding solvent). The block copolymer had a molecular weight of 11,400 and was eighty percent by weight PEO and twenty weight percent PPO. The block copolymer was seventy-eight volume percent PEO and twenty-two volume percent PPO.

The solution was then spun at 2000 rpm for 30 seconds on a Si wafer coated with TiN. The coated wafer was first baked at a temperature of about 100° C. for about 30 minutes to remove the solvent and precure the glass resin. Then the wafer was placed in a nitrogen atmosphere and soaked for more than 1 hour. The wafer was heated to a temperature of 500° C. at a rate of 1.5° C./min and was maintained at 500° C. for 2 hours.

The dielectric constant of the resulting material was in the range of about 1.7 to about 1.8.

EXAMPLE 16

A solution of polymer and glass resin was prepared by combining a block copolymer of PEO-PPO-PEO and MSQ. The solution contained fifty percent by weight of block copolymer and fifty percent glass resin (excluding solvent). The block copolymer had a molecular weight of 11,400 and was eighty percent by weight PEO and twenty weight percent PPO. The block copolymer was seventy-eight volume percent PEO and twenty-two volume percent PPO.

The solution was then spun at 2000 rpm for 30 seconds on a Si wafer coated with TiN. The coated wafer was first baked at a temperature of about 100° C. for about 30 minutes to remove the solvent and precure the glass resin. Then the wafer was placed in a nitrogen atmosphere and soaked for more than 1 hour. The wafer was heated to a temperature of 500° C. at a rate of 1.5° C./min and was maintained at 500° C. for 2 hours.

The dielectric constant of the resulting material was about 1.4 to about 1.6.

The present invention is described in terms of certain embodiments and examples. These embodiments and examples are provided to further describe the invention. One skilled in the art will appreciate that modifications to the embodiments and examples provided herein are possible without departing from the spirit and scope of the invention, which is defined in the appended claims.

What is claimed is:

1. A process for fabricating a device comprising:
    forming a layer of dielectric material on a substrate wherein the dielectric material is a combination of an amphiphilic block copolymer and an uncured and unmodified glass resin wherein the unmodified glass resin does not react with the amphiphilic block copolymer when cured in the presence of the amphiphilic block copolymer; and
    heating the substrate to a temperature that causes the glass resin to cure and the block copolymer to decompose.

2. The process of claim 1 wherein the dielectric material has an average pore size of 10 nm or less.

3. The process of claim 1 wherein the amphiphilic block copolymer comprises a first polymer block that is hydrophilic and a second polymer block that is hydrophobic and wherein the uncured glass resin is either hydrophobic or hydrophilic and wherein the amphiphilic block copolymer is miscible in the glass resin.

4. The process of claim 1 wherein the substrate is heated to a temperature of about 200° C. to about 500° C.

5. The process of claim 1 wherein the dielectric material is an organic polysilicate compound.

6. The process of claim 3 wherein the mixture of amphiphilic block copolymer and glass resin is about 5 weight percent to about 75 weight percent block copolymer and about 95 weight percent to about 25 weight percent glass resin.

7. The process of claim 3 wherein the mixture of amphiphilic block copolymer and glass resin is about 10 weight percent to about 60 weight percent block copolymer and about 90 weight percent to about 40 weight percent glass resin.

8. The process of claim 3 wherein the mixture of amphiphilic block copolymer and glass resin is about 10 weight percent to about 50 weight percent block copolymer and about 90 weight percent to about 50 weight percent glass resin.

9. The process of claim 3 wherein the block copolymer is about 5 weight percent to about 95 weight percent of the first polymer block and 95 weight percent to about 5 weight percent of the second polymer block.

10. The process of claim 3 wherein the block copolymer is about 10 weight percent to about 90 weight percent of the first polymer block and 90 weight percent to about 10 weight percent of the second polymer block.

11. The process of claim 3 wherein the block copolymer is about 20 weight percent to about 80 weight percent of the first polymer block and 80 weight percent to about 20 weight percent of the second polymer block.

12. The process of claim 3 wherein the block copolymer is selected from the group consisting of poly(propylene oxide-ethylene oxide), poly(methacrylic acid-perfluorinated methacrylate) and poly(propylene oxide-ethylene oxide-propylene oxide).

13. The process of claim 4 wherein the glass resin is cured prior to the complete decomposition of the block copolymer.

14. The process of claim 4 further comprising prebaking the substrate at a temperature of about 100° C. to about 140° C. before the heating step.

15. The process of claim 12 wherein the substrate is heated to a temperature of about 400° C. to about 500° C.

16. The process of claim 5 wherein the organic polysilicate compound is a silsesquioxane compound.

* * * * *